United States Patent [19]

Gergis

[11] 4,370,734
[45] Jan. 25, 1983

[54] SWITCHING METHOD FOR EFFECTING REPLICATION IN MAGNETIC BUBBLE DEVICES

[75] Inventor: Isoris S. Gergis, Yorba Linda, Calif.

[73] Assignee: The United States of America as represented by the Secretary of the Air Force, Washington, D.C.

[21] Appl. No.: 253,454

[22] Filed: Apr. 13, 1981

[51] Int. Cl.³ .............................................. G11C 19/08
[52] U.S. Cl. ..................................................... 365/12
[58] Field of Search .............................. 365/12, 15, 16

[56] References Cited

U.S. PATENT DOCUMENTS

| | | | |
|---|---|---|---|
| 3,781,833 | 12/1973 | Geusic | 365/12 |
| 4,012,726 | 3/1977 | Bonyhard et al. | 365/12 |
| 4,079,461 | 3/1978 | George et al. | 365/39 |
| 4,138,736 | 2/1979 | George et al. | 365/12 |

OTHER PUBLICATIONS

IEEE Transactions on Magnetics-vol. MAG-14, No. 1, Jan. 1978, pp. 1-4.

Primary Examiner—James W. Moffitt
Attorney, Agent, or Firm—Donald J. Singer; Willard R. Matthews

[57] ABSTRACT

Replication in a magnetic bubble device is realized by a method of operation that is based on the principle of stretching, then cutting the bubble by the control current pulses. In this mode of operation, the bubble is stretched, under the influence of a large amplitude current pulse in the control conductor, between the switch propagate element in the primary track and another propagate element in the secondary track. The bubble strip is let to propagate for a fraction of a field cycle after which a second large amplitude narrow pulse is applied to the control conductor to sever the bubble strip into two parts. One part propagates as would the original bubble in the primary track and the second part propagates in the secondary track.

1 Claim, 8 Drawing Figures

SWITCHING METHOD FOR EFFECTING REPLICATION IN MAGNETIC BUBBLE DEVICES

STATEMENT OF GOVERNMENT INTEREST

The invention described herein may be manufactured and used by or for the Government for governmental purposes without the payment of any royalty thereon.

BACKGROUND OF THE INVENTION

This invention relates to magnetic bubble domain propagation structures and in particular to a method for effecting replication in such devices.

Magnetic bubble devices of the type to which the invention applies generally comprise structures having a pattern of propagation elements forming a major loop along which magnetic bubbles propagate and a multiplicity of patterns of propagation structures forming minor loops about which bubble patterns move. Bubbles are moved from the minor loops into and along the major loop by means of replication. U.S. Pat. No. 4,012,726 entitled *Magnetic Bubble Replicator*, issued to Peter I. Bonyhard et al, Mar. 15, 1977 and U.S. Pat. No. 4,079,461 entitled *Gap Tolerant Bubble Domain Propagation Circuits*, issued to Peter K. George et al, Mar. 14, 1978 disclose magnetic bubble devices of this type and also provide a general background of magnetic bubble devices.

The present state of the art bubble replicators operate in what is called cut and transfer mode. Among these replicators are the so-called pickax and the sideway switches. In these switches the bubble stretches (or elongates) along its propagation path under the influence of the strong pole distribution on an oversized permalloy element that constitutes part of the switch. The replication is effected by applying to the control conductor a composite current pulse consisting of a large narrow pulse followed by a low current plateau that lasts for a little over a quarter of a field cycle. The bubble being elongated normal to the control conductor is cut into two parts (two bubbles). The trailing bubble is subsequently transferred with the aid of the low current plateau into the secondary propagation track which is placed nearby the switch. The cut and transfer type replicators suffer the disadvantage of narrow phase margin due to the fact that the bubble elongation is severely limited on the upper end of the bias margin by the bubble tendency to contract as the bias field increases. As the bubble dimensions decrease its transient time under the control conductor decreases and consequently the cut phase margin also decreases. Improvement of the phase margin by employing larger stretch element is limited by the minor loop spacing which is reflected in the storage density. That is to say the improvement in the phase margin can only be made at the expnese of lowering the storage bit density.

One state of the art approach to improving the performance of these devices comprehends a mode of operation in which the bubble is stretched between the switch propagate element in the primary track and another propagate element in the secondary track. The bubble strip is let to propagate for a fraction of a field cycle and is then severed into two parts. One part propagates in the primary track, and the second part of the bubble propagates in the secondary track. Bubble switches operating using this principle use the multiple chevron stack. Such switches, however, are not easily adaptable to the gap tolerant structure and thus are not compatible with high density bubble devices.

There currently exists the need, therefore, for the realization of an improvement of the replicate phase margin over that of the pickax type replicators by means of a replicator operating method that is also compatible with the gap tolerant structure. The present invention is directed towards satisfying that need.

SUMMARY OF THE INVENTION

Magnetic bubble repliation in magnetic bubble domain propagation structures is accomplished in accordance with the invention by a method of operation that is compatible with gap tolerant structure and that provides improved replicate phase margin. Magnetic bubble devices having a major bubble propagation loop coupled to one or more minor loops by a switch propagate element that is controlled by a control conductor element are operated in a stretch and cut mode. As a magnetic bubble propagates around a minor loop in response to the influence of a rotating magnetic field a first current pulse is applied to the control conductor element to effect attraction of the magnetic bubble to the switch propagate element. Continued rotation of the magnetic field stretches the bubble from the point of attraction on the switch propagate element along the minor loop. A second narrow current pulse is applied at an appropriate magnetic field phase angle to sever the elongated bubble, allowing one portion to be transmitted to and through the major loop via the switch propagate element and the other portion to continue propagating around the minor loop.

It is a principal object of the invention to provide a new and improved switching method for effecting magnetic bubble replication in magnetic bubble domain propagation structures.

It is another object of the invention to provide a method achieving replication in magnetic bubble devices that results in an improvement of the replicate phase margin over that of state-of-the-art replicators.

It is another object of the invention to provide a replication method for a magnetic bubble device that is compatible with its gap tolerant structure.

These together with other objects, features and advantages of the invention will become more readily appararent from the following detailed description when taken in conjunction with the illustrative embodiment in the accompanying drawings.

DETAILED DESCRIPTION OF THE PREFERRED EMBODIMENT

Figure 1:
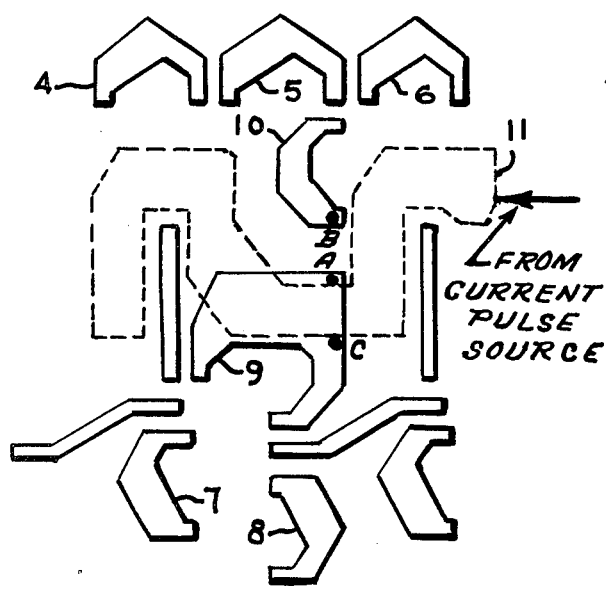
FIG. 1 is an illustration of a portion of the major and minor loops and switching mechanism of a magnetic bubble device of the type to which the invention applies.

The invention is directed to achieving replication in a magnetic bubble device by a switching method based on the principle of stretching, then cutting the magnetic bubble with control current pulses. The pertinent elements of such a magnetic bubble device are shown in FIG. 1. Referring thereto, the structure comprises a major loop shown in part by permalloy propagate elements 4, 5, 6 and a multiplicity of minor loops exemplified by permalloy propagate elements 7, 8, 9. A switch propagate element 10 is positioned between each minor loop and the major loop. A central conductor element 11 effects replication action in response to control pulses from a current source (not shown). Switch propagate element 10 is located close to minor loop propagate element 9 and both constitute part of the replicator switch. Switch propagate element 10 merges into the major loop and functions to transmit the replicated bubbles from the switch into the major loop. The control conductor element 11 zigzags across the minor loops and provides the control field necessary to accomplish the switching of the bubbles.

Figure 2A:
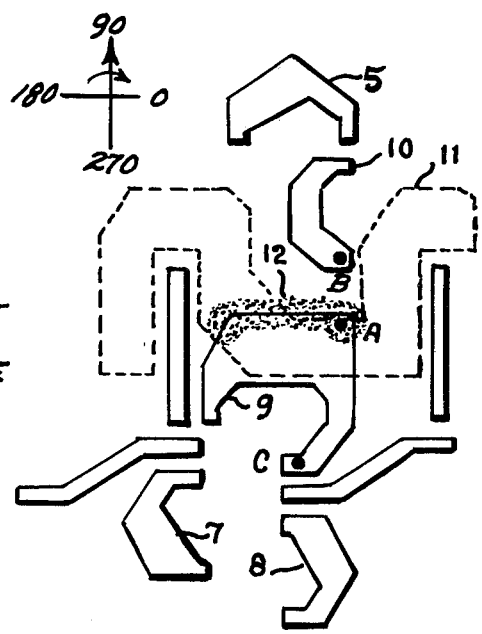
FIGS. 2a through 2c illustrate the propagation of a magnetic bubble around the minor loop of the magnetic bubble device of FIG. 1.
Figure 2B:
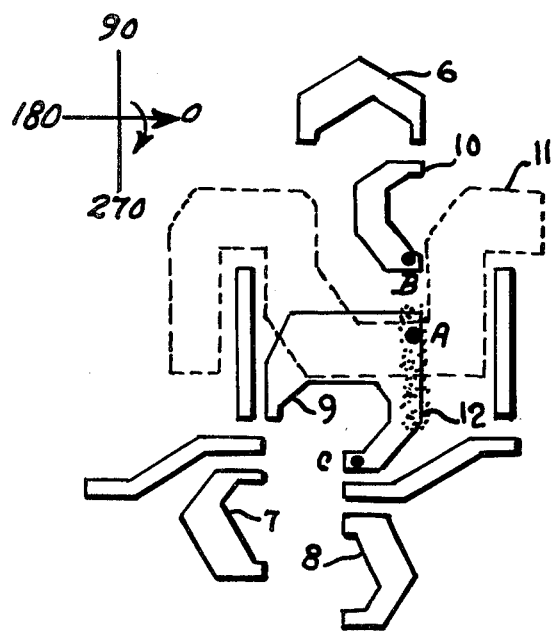
Figure 2C:
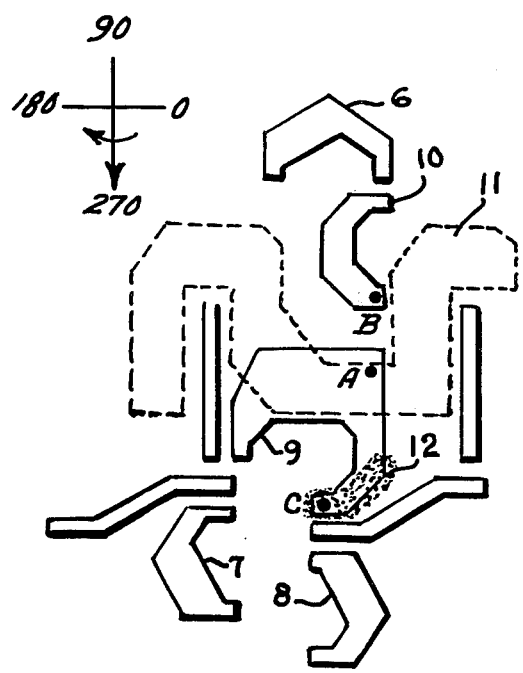
Figure 3A:
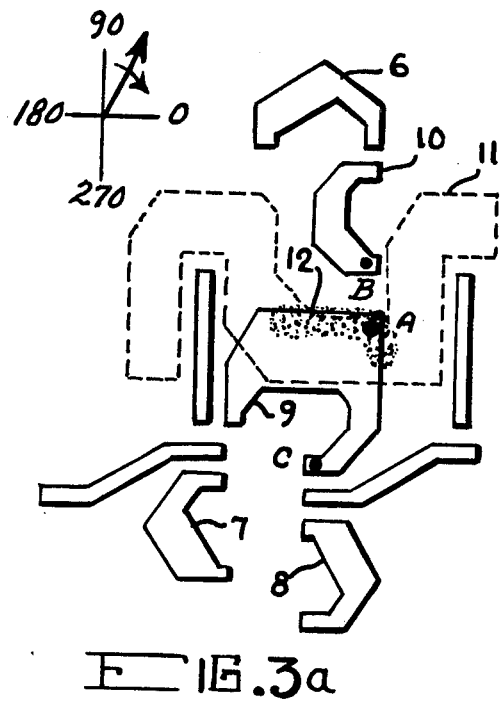
FIGS. 3a through 3d illustrate the propagation and replication of a magnetic bubble in accordance with the principles of the invention.
Figure 3B:
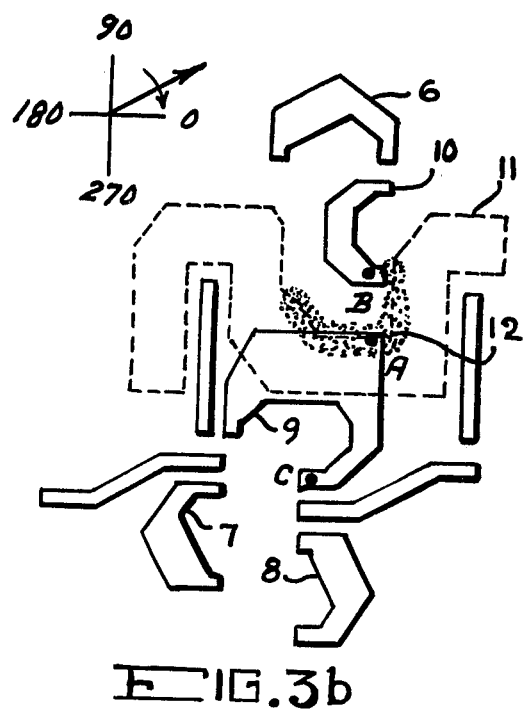
Figure 3C:
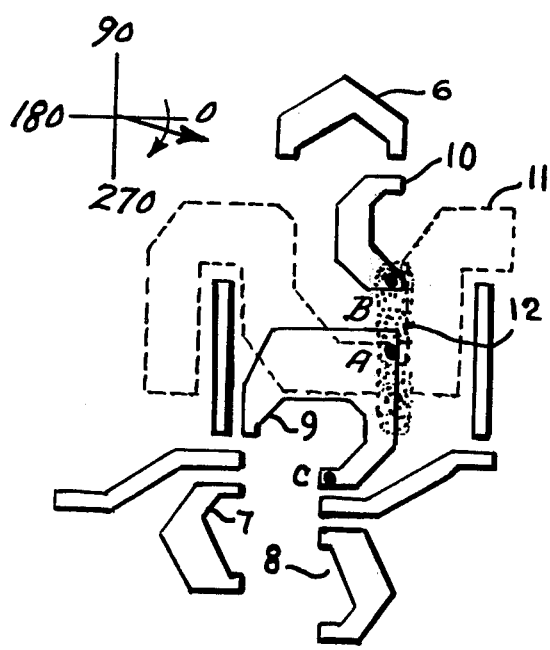
Figure 3D:
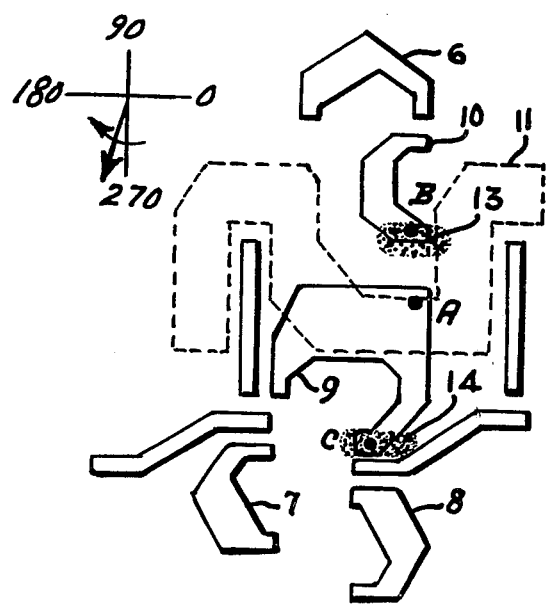

Under normal conditions (no switching) the magnetic bubble 12 propagates around element 9 in response to rotating magnetic field (not shown) as shown in the series of diagrams in FIGS. 2a–2c. The approximate bubble location is shown relative to the corresponding phase of the rotating field. When replication is desired, a current pulse is applied to the control conductor at approximately 45 degrees phase angle with such a polarity as to stretch the bubble along the vertical left side of the control conductor, i.e., at the side of the points A and B. The current amplitude should be sufficiently large to stretch the bubble between points A and B. The pulse is applied long enough until the pole at point B becomes attractive (approximate phase is 0 degrees) and the pulse is then terminated. As the field rotates the bubble strip stretches further as shown in the series of diagrams in FIGS. 3a–3d as its ends propagate away from each other. At approximately a phase of 270 degrees where the bubble is stretched between points B and C, a second narrow pulse of the same polarity as the first one is applied to cut the bubble strip along the right side of the control conductor 11. The two bubble portions 13, 14 resulting from severing the bubble strip are now located at Points B and C as shown in FIG. 3d. The trailing bubble portion 13 has now detached itself from switch propagate element 10. Since the pole at location A is strongly repulsive, this bubble will subsequently propagate on switch propagate element 10 and into the major loop. The leading bubble portion 14 being far away from the collapsing field at location C survives the effect of the cut pulse and proceeds in the minor loop as would the original bubble. Thus, the replication of the bubble is achieved. The advantage of the present switch over that of the pickax type switches are:

(1) Larger phase margin is achieved in the proposed switch. Experience with the stretch and cut type switches using the chevron elements has shown a phase margin of over 60 degrees compared to 40 degrees obtained with the pickax type replicators.
(2) There is no need to use oversized elements to achieve replication since bubble stretching is achieved by the control current rather than the permalloy field. Thus, closer minor loop spacing and consequently higher bit density should be expected in this design.

While the invention has been described in one presently preferred embodiment it is understood that the words which have been used are words of description rather than words of limitation and that changes within the purview of the appended claims may be made without departing from the scope and spirit of the invention in its broader aspects.

What is claimed is:
1. The method of effecting replication in a magnetic bubble domain propagation structure having an organization of propagate elements providing a major loop, at least one organization of propagate elements providing a minor loop wherein magnetic bubbles propagate in response to the influence of a clockwise rotating magnetic field, a magnetic field, a magnetic bubble switch propagate element associated with each minor loop for transmitting magnetic bubbles into said major loop, a control conductor element associated with each minor loop traversing each said minor loop, its associated magnetic bubble switch propagate element and a proximate propagate element of said major loop, and a current pulse source for delivering current pulses to said control conductor element, said method comprising the steps of:
applying a first current pulse to said control conductor element at approximately 45° phase angle of said rotating magnetic field, said current pulse having a magnitude and polarity adapted to attract a magnetic bubble to said bubble switch propagate element and stretch said magnetic bubble between said bubble switch propagate element and its proximate minor loop propagate element,
terminating said first current pulse at approximately 0° phase angle of said rotating magnetic field, and
applying a second, narrow, current pulse of the same polarity as said first current pulse to said control conductor element at approximately 270° phase angle of said rotating magnetic field, said second current pulse having an amplitude sufficient to sever said magnetic bubble.

* * * * *